United States Patent
Yu et al.

(10) Patent No.: US 6,191,946 B1
(45) Date of Patent: Feb. 20, 2001

(54) HEAT SPREADER WITH EXCESS SOLDER BASIN

(75) Inventors: Z. Zack Yu, Lititz; Arthur A. Good, Paradise, both of PA (US)

(73) Assignee: Thermal Corp., Georgetown, DE (US)

( * ) Notice: Under 35 U.S.C. 154(b), the term of this patent shall be extended for 0 days.

(21) Appl. No.: 09/476,813

(22) Filed: Jan. 3, 2000

(51) Int. Cl.[7] .................................................. H05U 7/20
(52) U.S. Cl. ......................... 361/704; 361/699; 361/700; 257/714; 257/715; 174/15.2; 165/80.2; 165/80.4
(58) Field of Search ................................. 361/695–697, 361/700–704; 174/15.2, 10.3; 165/80.2, 80.3, 80.4, 104.33; 257/714, 715

(56) References Cited

U.S. PATENT DOCUMENTS

| | | | |
|---|---|---|---|
| 5,095,404 | * | 3/1992 | Chao ..................................... 361/700 |
| 5,409,055 | * | 4/1995 | Tanaka et al. .................... 165/104.33 |
| 5,682,943 | * | 11/1997 | Yao et al. ........................ 165/104.21 |
| 5,826,645 | * | 10/1998 | Meyer, IV et al. .............. 165/104.33 |
| 5,959,837 | * | 9/1999 | Yu ......................................... 361/697 |
| 5,983,995 | * | 11/1999 | Shutou et al. ................... 165/104.33 |
| 6,062,299 | * | 5/2000 | Choo et al. ............................. 165/46 |

FOREIGN PATENT DOCUMENTS

| | | | |
|---|---|---|---|
| 403108747 | * | 5/1991 | (JP) . |
| 405013630 | * | 1/1993 | (JP) . |
| 410223814 | * | 8/1998 | (JP) . |

* cited by examiner

Primary Examiner—Leo P. Picard
Assistant Examiner—Boris L. Chervinsky
(74) Attorney, Agent, or Firm—Martin Fruitman

(57) ABSTRACT

The apparatus is a heat spreader for attachment to a device to be cooled, with heat pipes attached within holes in the heat spreader. Each of several heat pipes is soldered into a long hole formed between the top and bottom surfaces of a typical heat spreader, which is essentially a thick plate. The heat pipes extend out of one edge of the plate and connect the heat spreader to a heat sink such as an assembly of fins. In order to limit the overflow of solder when the heat pipes are soldered into the heat spreader, a shallow basin is formed in the edge of the plate around all the heat pipe entry holes. The basin creates sufficient additional volume to retain any excess solder which flows out of the holes, and prevents the solder from spreading onto the heat input surface of the heat spreader where it would adversely affect the thermal contact.

4 Claims, 2 Drawing Sheets

HEAT SPREADER WITH EXCESS SOLDER BASIN

BACKGROUND OF THE INVENTION

This invention deals generally with heat sinks for cooling electronic devices such as pumped lasers and integrated circuits, and more specifically with a heat spreader constructed so that solder spreading from holes into which heat pipes are inserted does not affect the nearby thermal transfer surface which contacts the electronic device.

As electronic devices are becoming more powerful, the task of removing heat from them is becoming more critical. In many situations the heat flow resistance between an electronic device, such as a pumped laser or an integrated circuit, and the heat spreader which removes heat from it accounts for a significant portion of the total thermal resistance in the device's cooling system. Since greater thermal resistance causes the device to run hotter for any given heat spreader temperature, it is very important to assure that the surface on the electronic device and the thermal contact surface of the heat spreader are kept as clean and as flat as possible to assure that the very best thermal conductivity is maintained between them.

However, even when a heat spreader is itself manufactured with a flat thermal contact surface, the thermal contact surface can be dramatically affected by the processes involved in attaching the heat spreader to the rest of the cooling assembly.

A typical electronic device cooling assembly in use today has very few major parts. One or more heat pipes are attached to the heat spreader, and the heat pipes are also attached to a heat removal device such as an assembly of cooling fins in order to transfer heat to the ambient air. Since the external structure of a typical heat pipe is a simple tube sealed at both ends, the method of attaching the heat pipe to the heat spreader is usually to drill long cylindrical holes into the plate-like heat spreader from one edge. The heat pipes are then attached within the holes of the heat spreader by inserting solder into the holes before the heat pipes are inserted, and then heating the entire assembly, while it is oriented with the heat pipes vertically above the heat spreader, so that the solder bonds the heat pipes to all the interior surfaces of the holes in the heat spreader. The heat pipes are then attached to the cooling fin assembly by epoxying the heat pipes into slots in the base plate of the fin assembly.

However, the process of soldering the heat pipes into the heat spreader causes a problem. Since it is important to use sufficient solder to bond the heat pipes to the entire inside surface of each deep hole in the heat spreader, and it is difficult to control the flow of solder or the creation of bubbles during the process, solder sometimes flows out of the holes and onto the nearby thermal contact surface of the heat spreader. This excess solder attached to the thermal contact surface of the heat spreader destroys its value, and the solder must either be removed or the assembly discarded. Either choice adds significantly to the cost of manufacture, and it would be very advantageous to have an electronic device cooling assembly in which the heat spreader thermal contact surface was protected from excess solder used to bond the heat pipe to the heat spreader.

SUMMARY OF THE INVENTION

The present invention prevents excess solder from spreading to the thermal contact surface of the heat spreader by adding a catch basin to the surface into which the holes for the heat pipe are formed. Thus, the openings of the holes for the heat pipes are placed within the basin and surrounded by the walls of the basin, and if any solder flows out of the holes, it is captured within the basin and can not flow out onto the thermal contact surface of the heat spreader. This simple structure completely eliminates the problem of excess solder from the heat pipe bonding process affecting the thermal contact surface of the heat spreader.

DETAILED DESCRIPTION OF THE INVENTION

Figure 1:
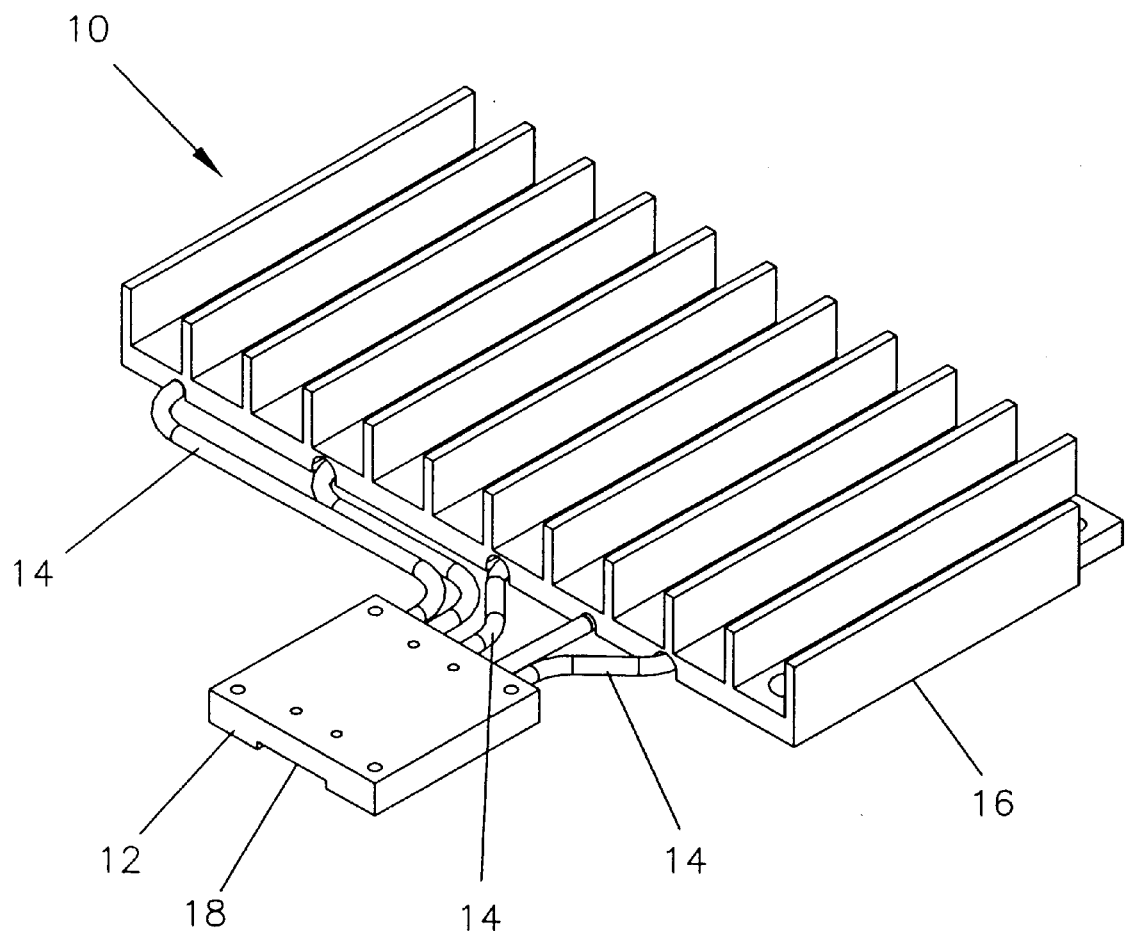
FIG. 1 is a perspective view of a typical electronic device cooling assembly.

FIG. 1 is a perspective view of a typical electronic device cooling assembly 10 showing the major components which are heat spreader 12, heat pipes 14, and cooling fin assembly 16. As can be seen in FIG. 1, heat pipes 14 interconnect heat spreader 12 and cooling fin assembly 16, and they transfer to the fins the heat generated by an electronic device (not shown) to which heat spreader 12 will be attached. The cooled device, typically a pumped laser or an integrated circuit, is attached at undercut surface 18 of heat spreader 12 which is the thermal contact surface of heat spreader 12.

Figure 2:
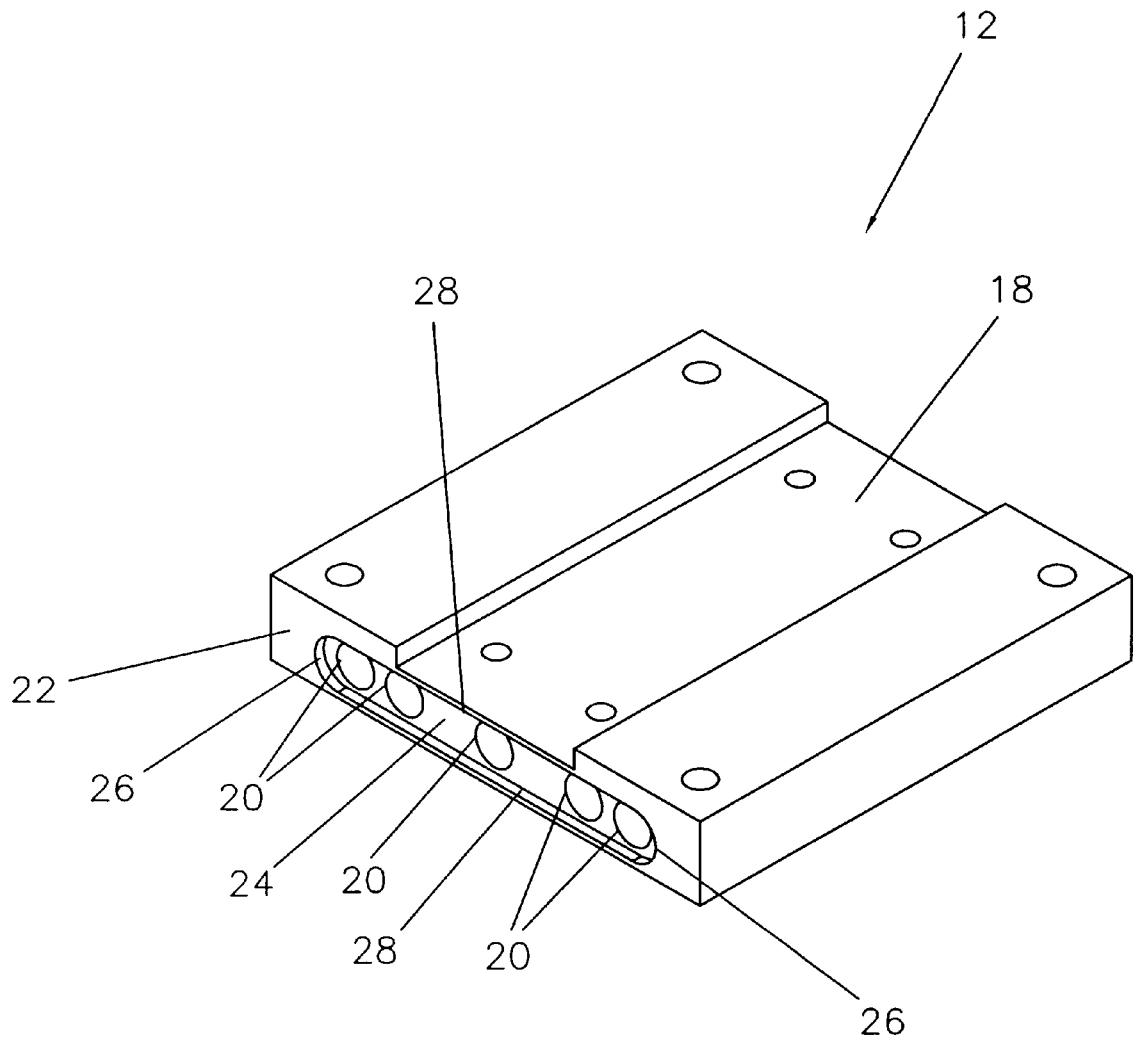
FIG. 2 is a perspective view of the heat spreader of the preferred embodiment of the invention.

Heat pipes 14 are attached to heat spreader 12 by being fitted into long cylindrical holes originating on a narrow side of heat spreader 12 (see FIG. 2). Heat pipes 14 are attached to heat spreader 12 by being soldered within the holes, and the preferred embodiment of the invention as shown in FIG. 2 prevents excess solder which may flow out of the holes from moving onto thermal contact surface 18 and preventing intimate contact between thermal contact surface 18 and a device attached to it.

FIG. 2 is a perspective view of heat spreader 12 of the preferred embodiment of the invention. Heat spreader 12 is conventional in that it includes thermal contact surface 18 which is to be attached to an electronic device (not shown) in order to transfer heat from the electronic device to fin assembly 16. Heat spreader 12 also includes long holes 20 entering at a narrow side 22 and extending almost to the opposite edge of heat spreader 12. As is conventional, heat pipes 14 (see FIG. 1) will be inserted and soldered into holes 20.

Heat spreader 12 differs in its structure from prior art heat spreaders in that it includes basin 24 within which the openings to all the holes 20 are located. Basin 24 is completely enclosed by its side walls 26 and top and bottom walls 28, so that any solder which may flow out of holes 20 has no access to thermal contact surface 18.

In the preferred embodiment, heat spreader 12 is 0.25 inch thick, thermal contact surface 18 is inset by 0.060 inch, and the thickness of top and bottom walls 28, at thermal contact surface 18 and at the bottom surface opposite from it, is 0.017 inch. The width of basin 24 is 1.3 inch, the height is 0.156, and the depth is 0.030 inch. These dimensions of basin 24 have been sufficient to prevent any excess solder from reaching thermal contact surface 18 when heat spreader 12 has five 0.125 inch diameter holes 20 having a depth of 1.36 inches.

Thus, the structural modification of the addition of basin 24 at the openings to holes 20 to otherwise conventional heat spreader 12, prevents a severe problem in the manufacturing of the heat spreader.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, the size of basin 24 described above is not critical to the invention, and it will normally vary with the structure of the heat spreader and the number and size of the holes for the heat pipes.

What is claimed as new and for which Letters patent of the United States are desired to be secured is:

1. A heat spreader for removing heat from a device to be cooled comprising:

a body with a thermal contact surface on one surface for attachment to a device to be cooled and at least one side adjacent to the thermal contact surface with the side including at least one hole with the hole dimensioned to accept a heat pipe to be soldered into the hole; and a basin formed in a side which has at least one hole for a heat pipe, with the basin defined by continuous walls which surround the holes and the basin having a depth sufficient so that any solder flowing from the holes is retained in the basin.

2. The heat spreader of claim 1 wherein the body is formed as a plate with a top surface and a bottom surface joined by sides.

3. The heat spreader of claim 1 wherein the thermal contact surface is recessed within a surface on which it is located.

4. The heat spreader of claim 1 wherein the holes for heat pipes extend from one side of the heat spreader substantially to the opposite side of the heat spreader.

* * * * *